United States Patent [19]
Nishimichi

[11] Patent Number: 5,347,232
[45] Date of Patent: Sep. 13, 1994

[54] PHASE LOCKED LOOP CLOCK GENERATOR

[75] Inventor: Yoshito Nishimichi, Osaka, Japan

[73] Assignee: Matsushita Electric Industrial Co. Ltd., Osaka, Japan

[21] Appl. No.: 61,016

[22] Filed: May 14, 1993

[30] Foreign Application Priority Data

May 15, 1992 [JP] Japan .................................. 4-123126
Jul. 17, 1992 [JP] Japan .................................. 4-190425

[51] Int. Cl.$^5$ ...................... H03L 7/095; H03L 7/10
[52] U.S. Cl. .................................... 331/1 A; 331/25; 331/74; 331/DIG. 2
[58] Field of Search ...................... 331/1 A, 17, 18, 25, 331/49, 57, 74, 172, DIG. 2, 4, 14, 44, 55

[56] References Cited

U.S. PATENT DOCUMENTS

| | | | |
|---|---|---|---|
| 3,795,872 | 3/1974 | Napolitano et al. | 331/55 X |
| 4,310,804 | 1/1982 | Ryon | 331/14 X |
| 4,368,438 | 1/1983 | Stienstra | 331/14 |
| 5,008,629 | 4/1991 | Ohba et al. | 331/14 X |
| 5,126,690 | 6/1992 | Bui et al. | 331/DIG. 2 X |
| 5,128,632 | 7/1992 | Erhart et al. | 331/DIG. 2 X |
| 5,142,247 | 8/1992 | Lada, Jr. et al. | 331/49 X |
| 5,214,677 | 5/1993 | Mori | 331/DIG. 2 X |
| 5,270,669 | 12/1993 | Jokura | 331/49 X |

OTHER PUBLICATIONS

Young et al., "A PLL Clock Generator with 5 to 110 MHz Lock Range for Microprocessors", IEEE International Solid-State Circuits Conference, Digest of Technical Papers, pp. 50–51 (Feb. 1992).

Primary Examiner—David Mis
Attorney, Agent, or Firm—Willian Brinks Hofer Gilson & Lione

[57] ABSTRACT

A phase locked loop (PLL) is disclosed, which produces a source clock signal which has a frequency twice that of a reference clock signal fed from the outside and is in synchronism with a reference clock signal. A timer counts pulses of a reference clock signal in order to measure time corresponding to the lock-in time of the PLL and delivers a count completion signal when the value of counting reaches a predetermined value. A start controller is in control of a clock buffer so that, after a count completion signal is delivered, the clock buffer starts feeding a source clock signal to a load circuit as an internal clock signal, in synchronism with a reference clock signal. A stop controller is also in control of the clock buffer so that, when a clock stop request signal becomes asserted, the clock buffer stops feeding an internal clock signal, in synchronism with a reference clock signal.

19 Claims, 12 Drawing Sheets

PHASE LOCKED LOOP CLOCK GENERATOR

BACKGROUND OF THE INVENTION

This invention relates to a clock generator employing a circuit known as a phase locked loop (PLL).

As microprocessors and microcontrollers incorporating IC's increase their operating frequency to 40 MHz and more, it is necessary to eliminate what is known in the art as clock skew, i.e., the delay between an external clock signal and an internal clock signal caused by a clock driver. From the viewpoint of system designs, for optimum performance, it is most advantageous to increase only the frequency of an internal clock signal, without increasing the frequency of an external clock signal. Therefore, clock generators employing a PLL have been commanding attention recently.

FIG. 12 shows a conventional clock generator with a PLL. Such a clock generator produces an internal clock signal whose frequency is twice that of an external clock signal. A phase detector 10 makes a comparison in phase between a reference clock signal 40 fed from the outside and a feedback clock signal 32 as a result of dividing the frequency of an internal clock signal 34 with a frequency twice that of the reference clock signal 40. The phase detector 10 then delivers to a loop filter 14 a signal proportional to a phase difference obtained by the comparison via a charge pump 12 in which the signal is converted into a voltage value proportional to the phase difference. With this voltage as a control voltage, a voltage-controlled oscillator (VCO) 16 produces a signal whose frequency is four times that of the reference clock signal 40. The VCO 16 is followed by a first divide-by-two 18, i.e., a frequency divider which is fed with an oscillation output delivered from the VCO 16 and produces; a 50% duty ratio signal with a frequency twice that of the reference clock signal 40 for driving a load circuit via a clock driver 21. The internal clock signal 34 which is an output signal of the clock driver 21 is further frequency-divided by two by a second divide-by-two 24 to become the feedback clock signal 32.

In accordance with the PLL described above, clock skew is reduced to a minimum by producing the internal clock signal 34 at a frequency twice that of the reference clock signal 40 and by synchronizing the reference clock signal 40 and the internal clock signal 34. An example of this type of clock generators is disclosed by I. A. Young et al in the paper entitled "A PLL Clock Generator with 5 to 110 MHz Lock Range for Microprocessors", ISSCC, DIGEST OF TECHNICAL PAPERS, pp. 50–51, Feb. 1992.

The foregoing techniques, however, have several disadvantages. For example, it is not possible to start clocking of the internal clock signal 34 at a particular phase. Additionally, it is not possible to interrupt such clocking at a particular phase.

In other words, at the time when the feed of the reference clock signal 40 to a PLL starts, the lock-in time necessary for the internal clock signal 34 to fall in synchronism with the reference clock signal 40 is required. During the duration of the lock-in time, the unauthorized internal clock signal 34, which is asynchronous with the reference clock signal 40, will have been fed to every lead circuit in IC's.

Further, if the feed of the reference clock signal 40 to a PLL is brought to a halt so as to interrupt the feed of the internal clock signal 34, this makes the phase detector 10 unable to function normally. The entire PLL is no longer in a phase-synchronization status, that is, the status of being locked-in. Disadvantageously, this results in the provisional feed of the internal clock signal 34 asynchronous with the reference clock signal 40 to the lead circuit. The restarting of clocking requires the lock-in time again. Likewise, the unauthorized internal clock signal 34, which is asynchronous with the reference clock signal 40, will have been fed to the lead circuit. Accordingly, it is not possible to momentarily restart the feed of the internal clock signal 34 at a cycle right after another at which the feed of the reference clock signal 40 comes to a stop.

Techniques for interrupting the internal clock signal 34 at any particular phase and restarting its clocking at any particular phase have beneficial effect on, for example, step execution and the interruption/restart of operation at the time of debugging in systems (both hardware and software) employing IC's, and further such techniques find applications in controlling clock signals for the management of power consumption in systems and IC's. However, due to the existence of lock-in time, it is not possible to learn the actual start/restart timing of clocking from the outside of an IC. This presents such a problem that the application/cancellation timing of a system reset signal cannot be fixed in a unique way.

DISCLOSURE OF THE INVENTION

Bearing in the mind the foregoing drawbacks in the prior art techniques, the present invention was made. It is an object of the invention to provide an improved clock generator capable of starting, interrupting, or restarting clocking of an internal clock signal at a particular phase. It is another object of the invention to realize the function of automatically timely canceling an internal reset signal in the status of being active, depending on the clocking of an internal clock signal.

In order to achieve the former object, the present invention employs an improved configuration in which a clock signal propagation control means for controlling the propagation of source clock signals is provided, so that no source clock signals are fed to a lead circuit as internal clock signals until a source clock signal delivered from a PLL falls in synchronism with a reference clock signal. Due to this configuration, an internal clock signal out of synchronism with a reference clock signal cannot make its way to a lead circuit.

Judgment on whether a source clock signal falls in synchronism with a reference clock signal can be made either by measuring time necessary for a PLL to fall in synchronism with a reference clock signal, or by examining whether a phase locking in PLL is achieved or not. In the case of the latter judgment method, it is preferable to introduce a phase detector with a phase detection precision lower than that of one provided in a PLL in order to improve the convergence of synchronization detection. If a synchronization detection signal is designed to be delivered when such a phase detector with a less precision has not detected any phase difference over plural pulse periods of a reference clock signal, this improves the likelihood of synchronization detection.

A clock signal propagation control means in accordance with the invention includes (a) a clock buffer, which intervenes between a PLL and a load circuit, for controlling the feed of an internal clock signal to the load circuit, (b) a start controller for controlling the clock buffer so that the clock buffer stops the feed of an internal clock signal to the load circuit during a period within which the PLL is nor in a locking-in status, while, in synchronism with a reference clock signal, it starts the feed of an internal clock signal when the PLL becomes locked-in, and (c) a stop controller for controlling the buffer circuit so that the clock buffer, when a clock stop request signal becomes asserted, stops the feed of an internal clock signal to the load circuit in synchronism with a reference clock signal, while, in synchronism with a reference clock signal, it immediately restarts the feed of an internal clock signal to the load circuit when that clock stop request signal becomes deasserted. This makes it possible not only to start or interrupt clocking of an internal clock signal at a particular phase but also to restart clocking of an internal clock signal rapidly at a particular phase.

In order to achieve the latter object of the invention, a reset control means is provided in the invention so as to automatically cancel the assertion of an internal reset signal after starting the feed of an internal clock signal. Due to this, it is not objectionable that the actual start-/restart timing of clocking of an internal clock signal cannot be learned from the outside. This reset control means has a counter which delivers a count completion signal to have an internal reset signal become deasserted at the time when it finishes counting just a given number of pulses of an internal clock signal or reference clock signal. Particularly, in the case of determining the assertion cancellation timing of an internal reset signal on the basis of the pulse count of an internal clock signal, the assertion cancellation of an internal reset signal after the start of the feed of an internal clock signal is assured.

PREFERRED EMBODIMENTS OF THE INVENTION

With reference to the drawings, preferred embodiments of the present invention are now described. In each of the following embodiments, an internal clock signal is given a frequency twice that of an external clock signal which serves as a reference clock signal. This, however, is not to be considered restrictive. Internal clock signals may, of course, have other frequencies.

FIRST EMBODIMENT

Figure 1:
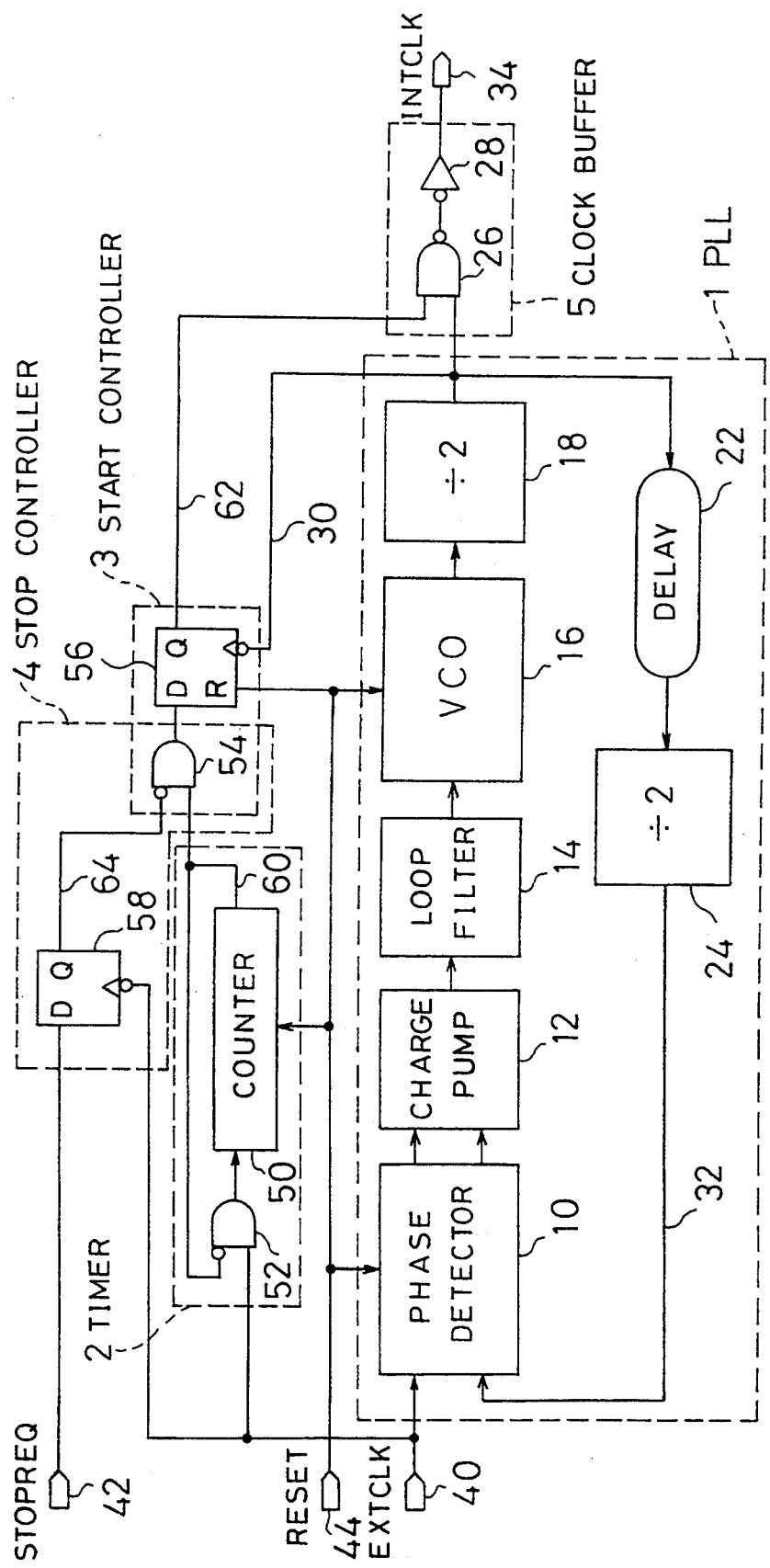
FIG. 1 is a block diagram showing a clock generator of a first embodiment of the present invention.

As shown in FIG. 1, a clock generator in accordance with a first embodiment comprises a phase locked loop (PLL) 1, a timer 2, a start controller 3, a stop controller 4, and a clock buffer 5. The PLL 1 is a closed loop circuit which contains a phase detector 10, a charge pump 12, a loop filter 14, a voltage-controlled oscillator (VCO) 16, a first divide-by-two 18, a delay circuit 22, and a second divide-by-two 24. The timer 2 has a counter 50 and a first AND circuit 52. The start and stop controllers 3 and 4 are composed of a second AND circuit 54, a first flip-flop 56, and a second flip-flop 58. The clock buffer 5 has a third AND circuit 26 and an inverter 28.

The phase detector 10 is fed with a reference clock signal 40 supplied from the outside and a feedback clock signal 32 delivered from the second divide-by-two 24. The phase detector 10 gives an output to the charge pump 12. The charge pump 12 gives an output to the loop filter 14. The loop filter 14 then gives an output to the VCO 16. The VCO 16 gives an output to the first divide-by-two 18. The first divide-by-two 18 delivers a source clock signal 30. This source clock signal 30 is fed to the third AND circuit 26 in the clock buffer 5 as one input, applied to the delay circuit 22, and provided to the first flip-flop 56 as a clock input. An output of the delay circuit 22 enters the second divide-by-two 24 for generating a feedback clock signal 32.

The reference clock signal 40 is also fed to the first AND circuit 52 as one input and to the second flip-flop 58 as a clock input. An output of the first AND circuit 52 is fed to the counter 50. The counter 50 delivers a count completion signal 60. This count completion signal 60 is applied to the second AND circuit 54 as one input as well as to the first AND circuit 52 as the other input. A clock stop request signal 42, which is provided from the outside, is fed to the second flip-flop 58 as a data input. A clock stop control signal 64 delivered from the second flip-flop 58 is applied to the second AND circuit 54 as the other input. An output of the second AND circuit 54 is given to the first flip-flop 56 as a data input.

A clock propagation control signal 62 delivered from the first flip-flop 56 is given to the third AND circuit 26 as the other input. An output of the third AND circuit 26 is fed to a load circuit as the internal clock signal 34 via the inverter 28. A reset signal 44, which is provided from the outside, is fed to the phase detector 10, to the VCO 16, to the counter 50, and to the first flip-flop 56.

The operation of the above-described clock generator is explained. The phase detector 10 makes a comparison in phase between the reference clock signal 40 and the feedback clock signal 32 as a result of dividing the source clock signal 30 with a frequency twice that of the reference clock signal 40 by two. A pulse signal which is produced according to a phase difference as a result of the comparison is transmitted to the loop filter 14 via the charge pump 12. Both the charge pump 12 and the loop filter 14 perform the function of converting such a pulse signal into a voltage value. The VCO 16, with a voltage according to the phase difference as a control voltage, generates a signal whose frequency is four times that of the reference clock signal 40. The first divide-by-two 18 changes an oscillation output of the VCO 16 to the source clock signal 30, i.e., a 50% duty ratio signal whose frequency is twice that of the reference clock signal 40. By way of the delay circuit 22, this source clock signal 30 makes its way to the second divide-by-two 24 in which it is divided by two to become the feedback clock signal 32. The PLL 1 operates as above.

The clock buffer 5 drives load circuits with the internal clock signal 34 as a result of buffering the source clock signal 30. When driving a load circuit, delay of a certain length occurs. This causes the difference in phase between the source clock signal 30 and the internal clock signal 34. To cope with such a phase difference, the delay circuit 22 is inserted into a feedback loop of the PLL 1, and the value of delay at the delay circuit 22 is set so that it agrees with both the value of delay at the second divide-by-two 24 and the value of delay at the clock buffer 5. As described here, the internal clock signal 34 whose frequency is twice that of the reference clock signal 40 is generated, and the clock skew between the reference clock signal 40 and the internal clock signal 34 is reduced to a minimum because the reference clock signal 40 and the internal clock signal 34 are made to be in phase.

In synchronism with the trailing edge of the reference clock signal 40, the counter 50 counts pulses of the reference clock signal 40. After completion of counting a set number of times, the counter 50 outputs a count completion signal 60. The number of pulses of the reference clock signal 40 to be counted by the counter 50 is set to above a value necessary for the PLL 1 to be locked-in to the reference clock signal 40. Further, the number of pulses to be counted by the counter 50 may be fixed hardwarily or established softwarily based on certain control. The count completion signal 60 is synchronized on the trailing edge of the source clock signal 30 in the first flip-flop 56, thereafter being applied to the clock buffer 5 as the clock propagation control signal 62 so as to make the source clock signal 30 propagate to a load circuit. During a period within which the counter 50 stops delivering the count completion signal 60, the clock buffer 5 is controlled by the clock propagation control signal 62 so that the source clock signal 30 is not applied to a load circuit. Further, until the PLL 1 becomes locked-in to the reference clock signal 40, application of the source clock signal 30 whose phase and frequency has not been assured yet to a load circuit is prevented. Once the counter 50 sends out the count completion signal 60, the first AND circuit 52 prevents the reference clock signal 40 from propagating to the counter 50. This stops the counter 50 to count, thereby eliminating unnecessary counting, in other words, the count completion signal 60 is self-held.

The clock stop request signal 42 is synchronized on the trailing edge of the reference clock signal 40 to become the clock stop control signal 64 in the second flip-flop 58. In the clock buffer 5, this clock stop control signal 64 functions to prevent the source clock signal 30 from propagating to a load circuit. The clock stop request signal 42 is used when it is necessary to forcefully stop the feed of the source clock signal 30 to a load circuit no matter which status the PLL 1 and the counter 50 are in.

Figure 2:
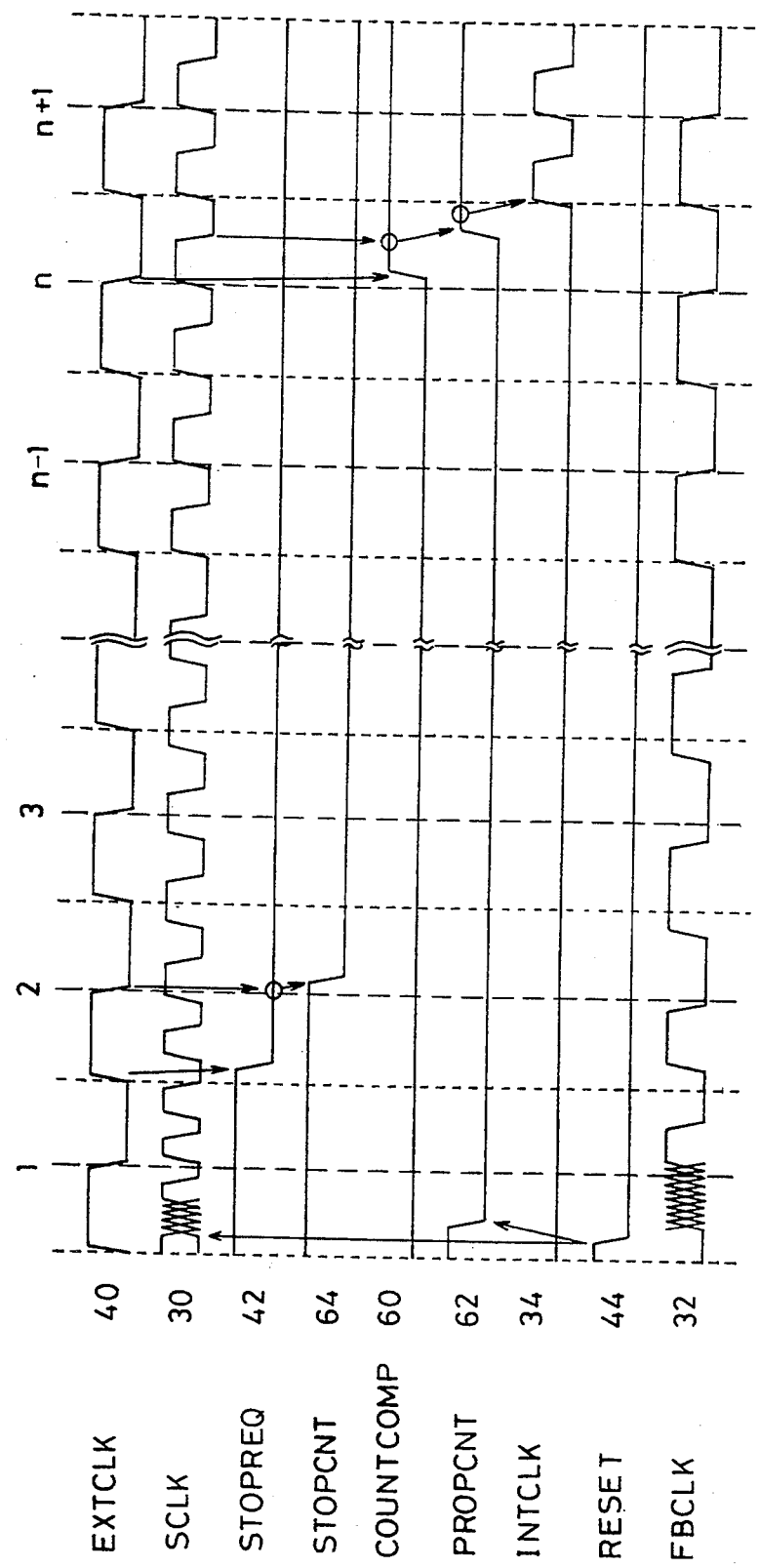
FIG. 2 is a timing diagram showing a sequence in which internal clock signals start being generated in the clock generator of the first embodiment.

By referring to FIG. 2, a sequence in which the internal clock signal 34 starts being generated in the present clock generator is explained. If, in synchronism with the reference clock signal 40, the reset signal 44 is canceled at cycle 1, the VCO 16 starts oscillating. Then, in synchronism with the trailing edge of the reference clock signal 40, the counter 50 starts counting pulses of the reference clock signal 40. The PLL 1 functions so that the reference clock signal 40 and the feedback clock signal 32 delivered from the second divide-by-two 24 become the same in frequency as well as in phase. If, after cancellation of the reset signal 44, the clock stop request signal 42 is canceled in synchronism with the leading edge of the reference clock signal 40 at cycle 2, this causes the second flip-flop 58 to negate the clock stop control signal 64. This clock stop control signal 64 is then applied to the second AND circuit 54, and in order to control the clock propagation control signal 62 with the count completion signal 60 generated by the counter 50, control paths are switched. If, in synchronism with the trailing edge of the reference clock signal 40, the counter 50 sends out the count completion signal 60 at cycle n, the clock propagation control signal 62 is asserted, at the same cycle, in synchronism with the trailing edge of the source clock signal 30 which then activates the clock buffer 5. This causes the internal clock signal 34 to be generated at cycle n+1 so as to drive a load circuit.

The pulse count of the reference clock signal 40 to be counted by the counter 50 is established to above a value sufficient enough for the PLL 1 to be locked-in. This allows the clock buffer 5 to stop the feed of the internal clock signal 34 asynchronous with the reference clock signal 40 to a load circuit. After generation of the source clock signal 30 in sufficiently synchronism with the reference clock signal 40, such a source clock signal 30 is fed to a load circuit as the internal clock signal 34.

Figure 3:
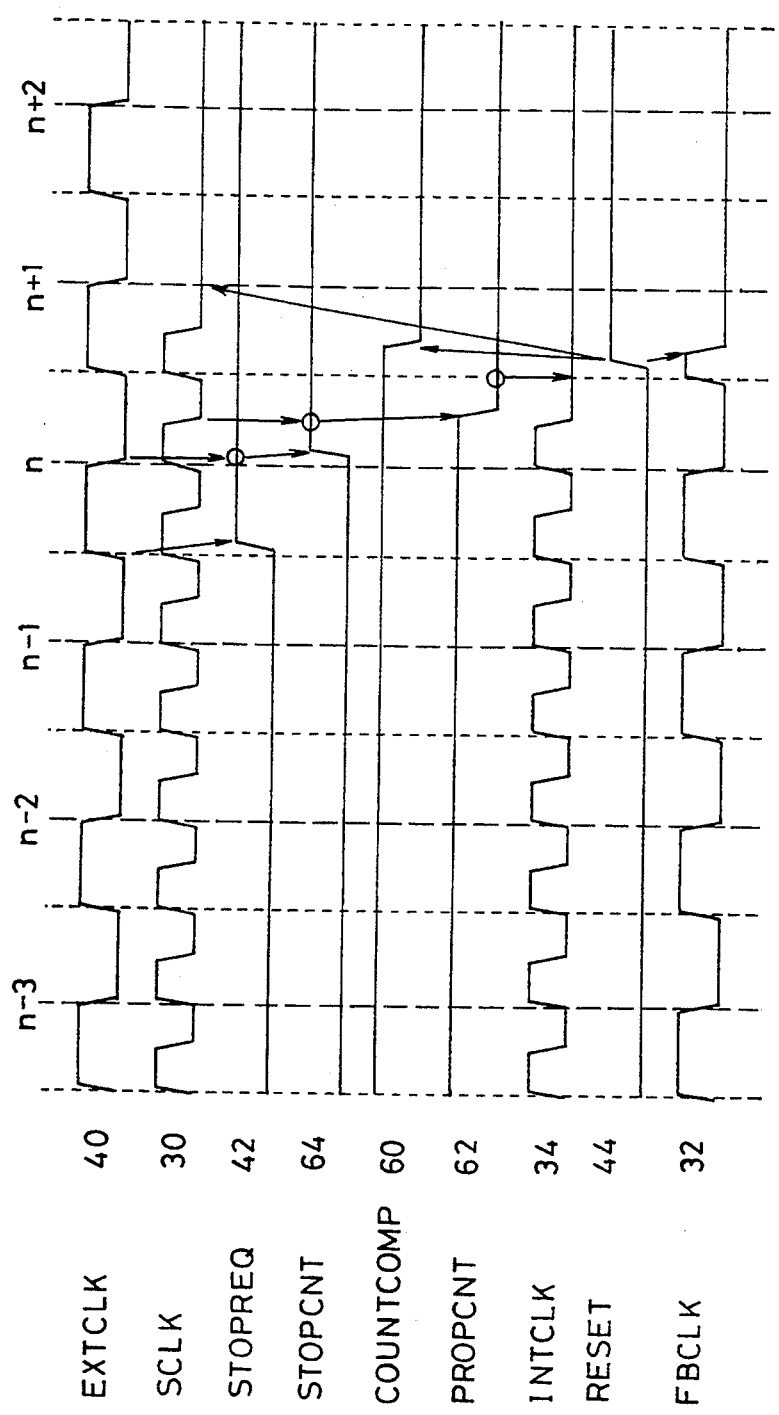
FIG. 3 is a timing diagram showing a sequence in which the feed of internal clock signals comes to a stop in the clock generator of the first embodiment.

With reference to FIG. 3, a sequence in which the feed of the internal clock signal 34 is stopped in a clock generator of this embodiment is described. If, in synchronism with the leading edge of the reference clock signal 40, the clock stop request signal 42 is put in an assertion status at cycle n, this causes the clock stop control signal 64 to become asserted in synchronism with the trailing edge of the reference clock signal 40 at the same cycle. The clock stop control signal 64 is synchronized on the trailing edge of the source clock signal 30 to become the clock propagation control signal 62. This clock propagation control signal 62 prevents the clock buffer 5 from generating the internal clock signal 34 to drive a load circuit. Because of this, it is possible to stop the feed of the internal clock signal 34 at the next reference clock cycle after another at which the clock stop request signal 42 becomes asserted.

As seen from FIG. 3, if, in synchronism with the leading edge of the reference clock signal 40, the reset signal 44 is put in an assertion status at the following cycle, that is, cycle n+1, this causes all of the phase detector 10, the VCO 16, the counter 50, and the first flip-flop 56 to reset. By bringing the operation of the PLL 1 to a halt at the time when the feed of the internal clock signal 34 is being stopped, it is possible to achieve power consumption reduction. Cancellation of the count completion signal 60 makes it possible to measure the length of lock-in time at the time of rerunning.

Figure 4:
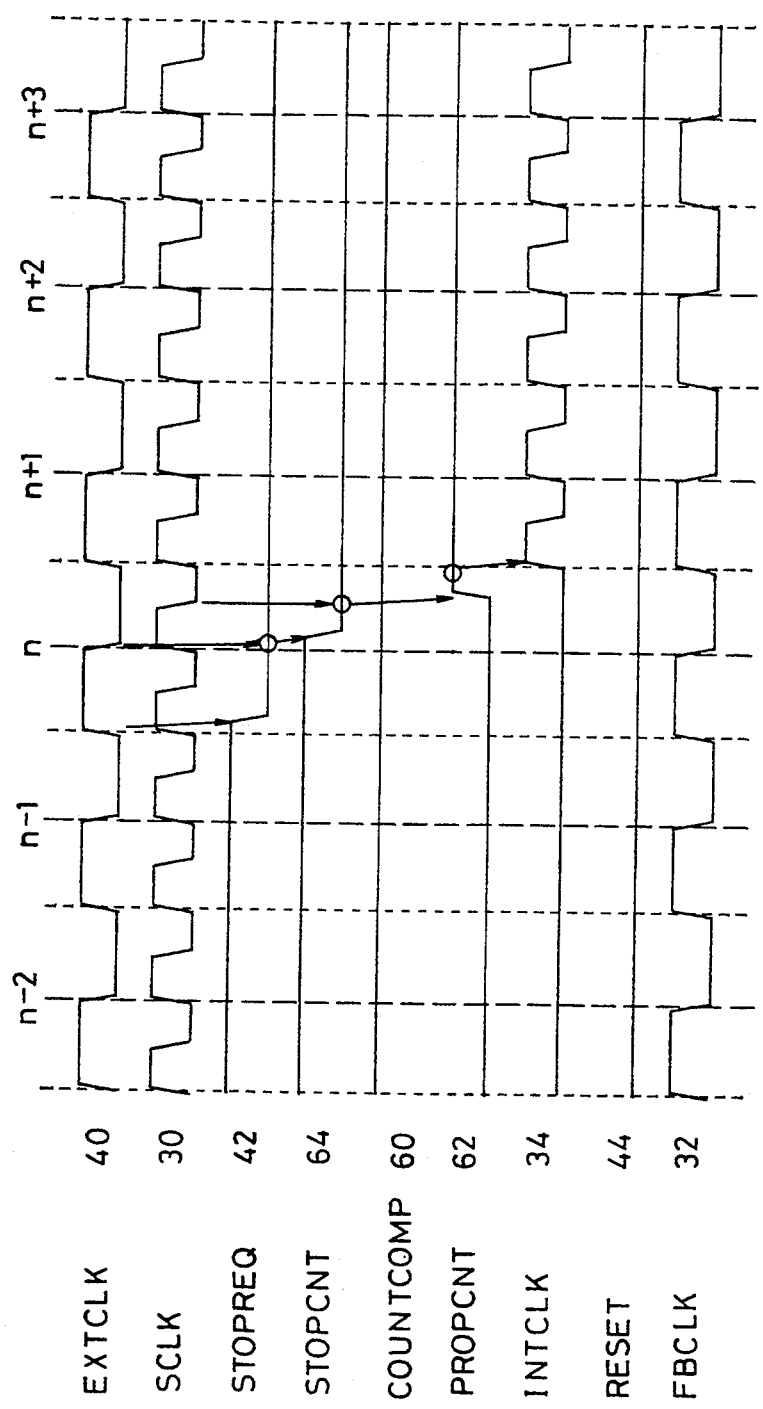
FIG. 4 is a timing diagram showing a sequence in which the feed of internal clock signals restarts in the clock generator of the first embodiment.

In the case where the reset signal 44 does not become asserted at cycle n+1, the PLL 1 keeps operating and the count completion signal 60 is held. Thus, it is possible to restart clocking rapidly. FIG. 4 shows a sequence for restarting the feed of the internal clock signal 34 in an interruption status without the provision of the reset signal 44. If, in synchronism with the trailing edge of the reference clock signal 40, the clock stop request signal 42 becomes deasserted at cycle n, this causes the clock stop control signal 64 to become deasserted at that cycle in synchronism with the trailing edge of the reference clock signal 40. The clock stop control signal 64 thus deasserted is synchronized on the trailing edge of the source clock signal 30, and the clock propagation control signal 62 is delivered so as to allow the clock buffer 5 to generate the internal clock signal 34 for driving a road circuit. Accordingly, it is possible to restart the feed of the internal clock signal 34 at a reference clock cycle immediately following another at which the clock stop request signal 42 becomes deasserted.

In accordance with this embodiment as described above, the counter 50 counts the number of pulses necessary for the PLL 1 to be locked-in to the reference clock signal 40 for generating the clock propagation control signal 62, so that, until the PLL 1 is locked-in to the reference clock signal 40, the propagation of the source clock signal 30 to a load circuit is inhibited at the clock buffer 5. This makes it possible to realize a clock generator capable of starting clocking of the internal clock signal 34 at any particular phase. Additionally, based on the clock stop request signal 42, the clock buffer 5 is controlled. This realizes a clock generator capable of performing the function of interrupting or restarting clocking at a particular phase.

Additionally, even though the delay circuit 22 is not provided in the PLL 1, it is possible to eliminate clock skew by making the second divide-by-two 24 have appropriate delay.

SECOND EMBODIMENT

Figure 5:
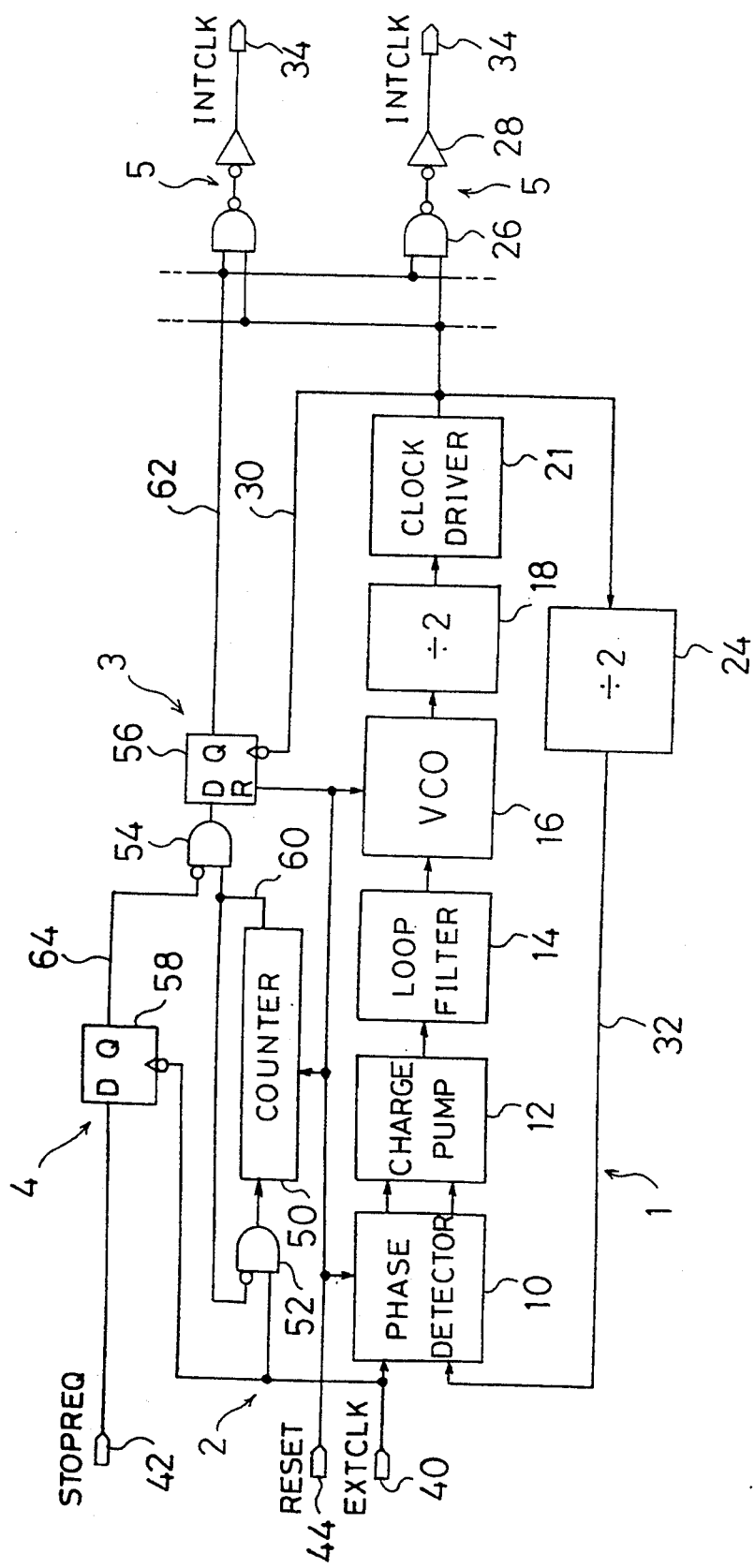
FIG. 5 is a block diagram showing a clock generator in accordance with a second embodiment of the present invention.

As shown in FIG. 5, a clock generator in accordance with a second embodiment comprises the PLL 1, the timer 2, the start controller 3, the stop controller 4, and plural clock buffers 5. The PLL 1 is a closed loop circuit which contains the phase detector 10, the charge pump 12, the loop filter 14, the VCO 16, the first divide-by-two 18, a clock driver 21, and the second divide-by-two 24. Each of the timer 2, the start controller 3, the stop controller 4, and the clock buffers 5 has the same configuration as that shown in the first embodiment. However, the clock buffers 5 are arranged in proximity to a plurality of load circuits each constituting a functional block in IC's.

In the PLL 1, the clock driver 21 delivers the source clock signal 30 based on the output of the first divide-by-two 18. This source clock signal 30 is applied to each of the clock buffers 5, and to the second divide-by-two 24 and is given to the first flip-flop 56 constituting the start controller 3 as a clock input. Additionally, the clock propagation control signal 62 delivered from the first flip-flop 56 is applied to each of the clock buffers 5.

Figure 12:
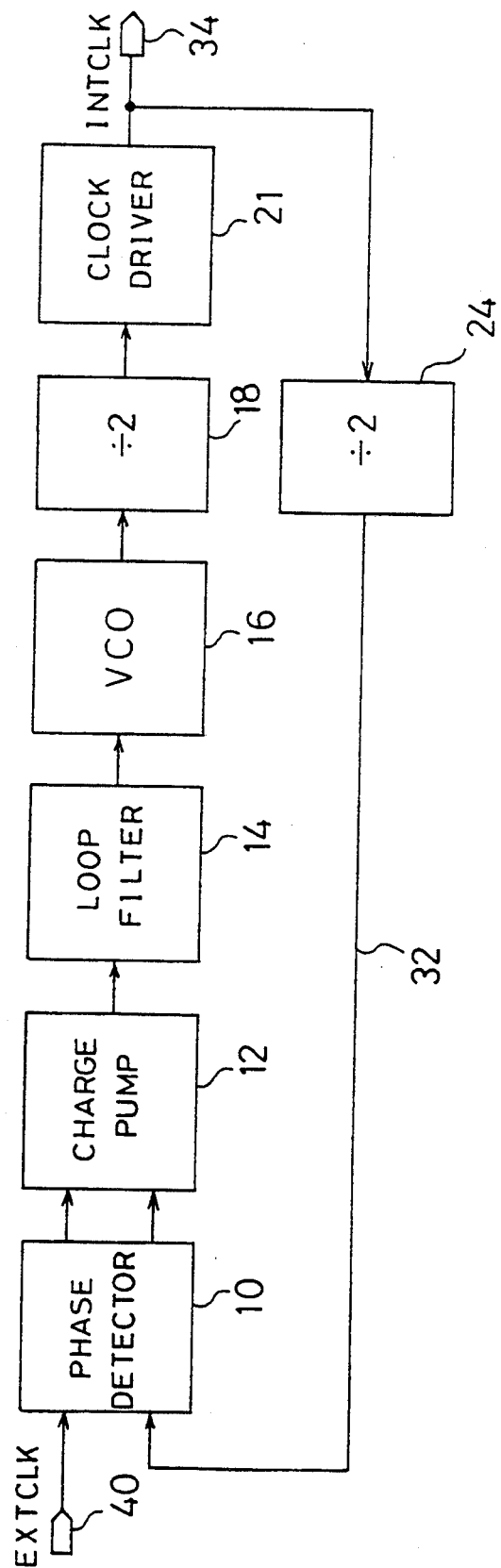
FIG. 12 is a block diagram showing a conventional clock generator.

Because of the provision of the clock driver 21 at the output stage of the PLL 1, delay of the source clock signal 30 with respect to the reference clock signal 40 is limited only to the delay within the second divide-by-two 24. Additionally, the propagation of the source clock signal 30 is controlled in each of the clock buffers 5 arranged on the load circuits. In other words, the clock skew between the reference clock signal 40 and the internal clock signal 34 can be reduced to the same degree that prior art techniques can achieve (see FIG. 12), even though the delay circuit 22 is not provided in the PLL 1.

THIRD EMBODIMENT

Figure 6:
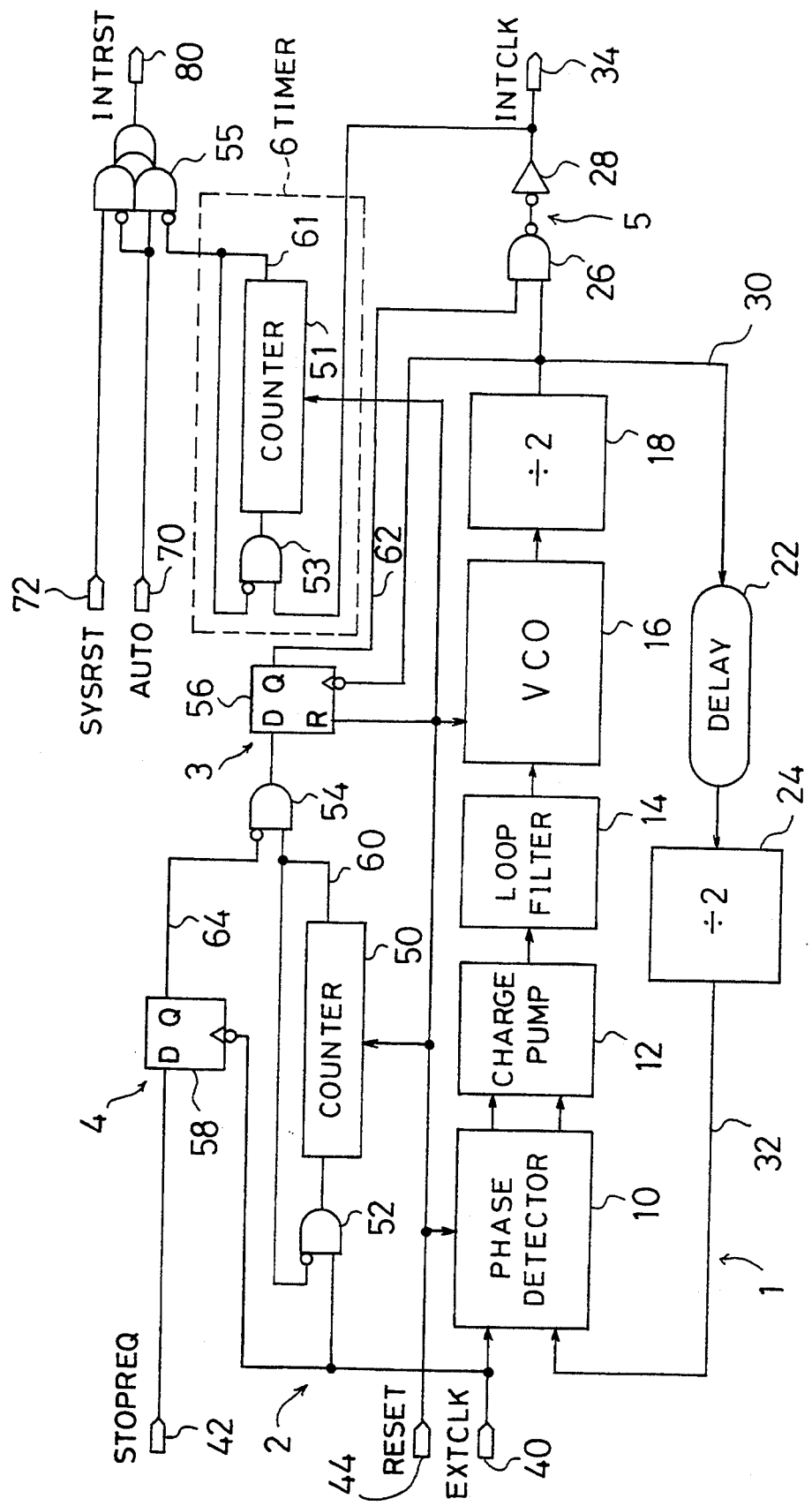
FIG. 6 is a block diagram showing a clock generator of a third embodiment of the present invention.

As seen from FIG. 6, a clock generator in accordance with a third embodiment has the same elements that the one in the first embodiment does, but it further includes a reset control means comprising a second timer 6 and a signal selector 55. The second timer 6 has the same configuration as the first timer 2 and is provided with a second counter 51 and a fourth AND circuit 53.

The internal clock signal 34 delivered from the clock buffer 5 is applied to the fourth AND circuit 53 as one input. The fourth AND circuit 53 gives an output to the second counter 51. A second count completion signal 61 is delivered from the second counter 51, which is fed not only to the signal selector 55 as a first input signal to be selected and but also to the fourth AND circuit 53 as the other input. The signal selector 55 is further fed with a system reset signal 72 as a second input signal to be selected and an auto-reset control signal 70 as a selection control signal. An internal reset signal 80 is delivered from the signal selector 55, which, together with the internal clock signal 34, is fed to a load circuit. The reset signal 44, which is supplied from the outside, is utilized to reset not only the phase detector 10, the VCO 16, the first counter 50, and the first flip-flop 56 but also the second counter 51.

The signal selector 55, in response to the auto-reset control signal 70, performs the function of switching reset modes. In other words, if the auto-reset control signal 70 is set to "H" level, this results in selecting auto-reset mode, while on the other hand non-auto-reset mode is selected if it is set to "L" level. These two reset modes are modes relating to the application method of the internal reset signal 80 used to reset a load circuit as a target functional block.

Auto-reset mode is a mode in which the internal reset signal 80 is kept asserted just for the cycle count set to the second counter 51 when the generation of the internal clock signal 34 starts, and then the assertion of the internal reset signal 80 is canceled automatically (that is, the internal reset signal 80 is automatically deasserted). The second counter 51 counts a set number of pulses of the internal clock signal 34, in synchronism with the leading edge of the internal clock signal 34. Upon finishing such counting, the second counter 51 delivers the second count completion signal 61. The pulse count of the internal clock signal 34 to be counted is set to a value necessary for resetting a load circuit. Such pulse count setting may be fixed hardwarily or established softwarily based on certain control. The second count completion signal 61 is applied to the signal selector 55 so as to control the application of the internal reset signal 80 to a load circuit. Once the second count completion signal 61 is delivered, the fourth AND circuit 53 prevents the internal clock signal 34 from propagating to the second counter 51 thereby bringing the operation of counting by the second counter 51 to a halt. This eliminates unnecessary counting operations to happen.

On the other hand, non-auto-reset mode is a mode in which the system reset signal 72 is directly delivered as the internal reset signal 80 no matter which internal status the second counter 51 is in.

Figure 7:
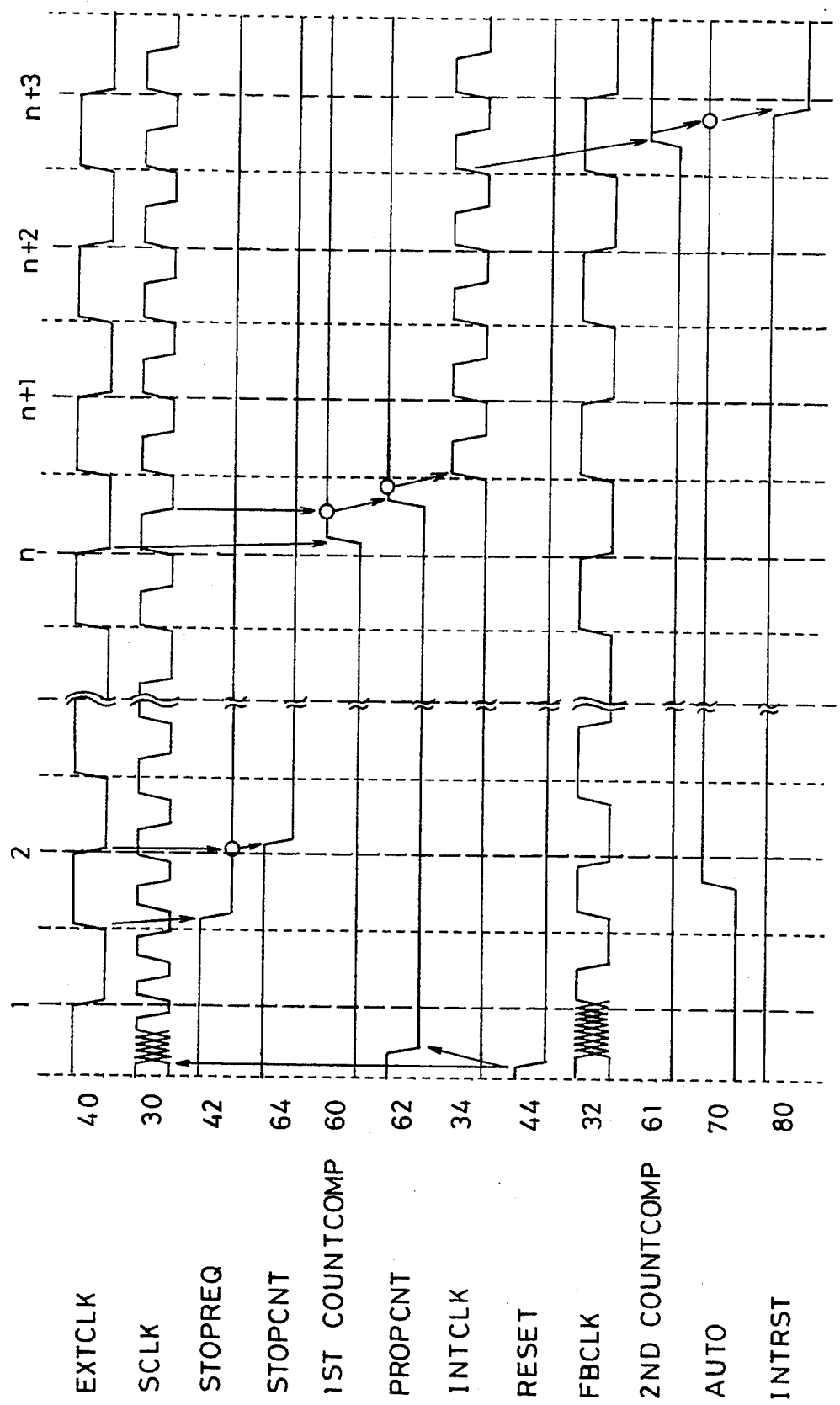
FIG. 7 is a timing diagram showing a sequence in which internal clock signals start being generated in auto-reset mode in the clock generator of FIG. 6.

FIG. 7 is a timing chart showing the operation in auto-reset mode. In synchronism with the reference clock signal 40, the reset signal 44 is canceled at cycle 1. This causes the VCO 16 to begin oscillating. The PLL 1 functions so that the reference clock signal 40 and the feedback clock signal 32 delivered from the second divide-by-two 24 become the same in frequency as well as in phase. As already described in the first embodiment, the feed of the internal clock signal 34 starts at cycle n+1 for driving a load circuit. If the reset signal 44 is canceled, the second counter 51 counts, in synchronization with the leading edge of the internal clock signal 34, a set number of pulses of the internal clock signal 34, thereafter delivering the second count completion signal 61 upon completion of such counting. In auto-reset mode during which the auto-reset control signal 70 at "H" level is being provided, the signal selector 55 keeps asserting the internal reset signal 80 until the second counter 51 delivers the second count completion signal 61. Once the second count completion signal 61 is delivered from the second counter 51, the internal reset signal 80 becomes deasserted. In a sequence in which the feed of the internal clock signal 34 is interrupted and then restarted, the auto-reset control signal 70 is set to "L" level so that the internal reset signal 80 is not delivered at the time when the feed of the internal clock signal 34 restarts.

In accordance with tills embodiment;, the second counter 51 counts the number of cycles at which the internal reset signal 80 is to be applied. The internal reset signal 80 is kept provided for a predetermined period since clocking of the internal clock signal 34 starts. Thereafter, the internal reset signal 80 is canceled automatically, so that it is possible to provide the internal reset signal 80 without taking in account the initial timing of clocking of the internal clock signal 34. Further, the application time of the internal reset signal 80 can be controlled easily by changing values with respect to the second counter 51.

The second counter 51 may count pulses of the reference clock signal 40 instead of those of the internal clock signal 34, provided that values established to the second counter 51 are greater than those set to the first counter 50 so as to deassert the internal reset signal 80 after the feed of the internal clock signal 34 commences.

FOURTH EMBODIMENT

Figure 8:
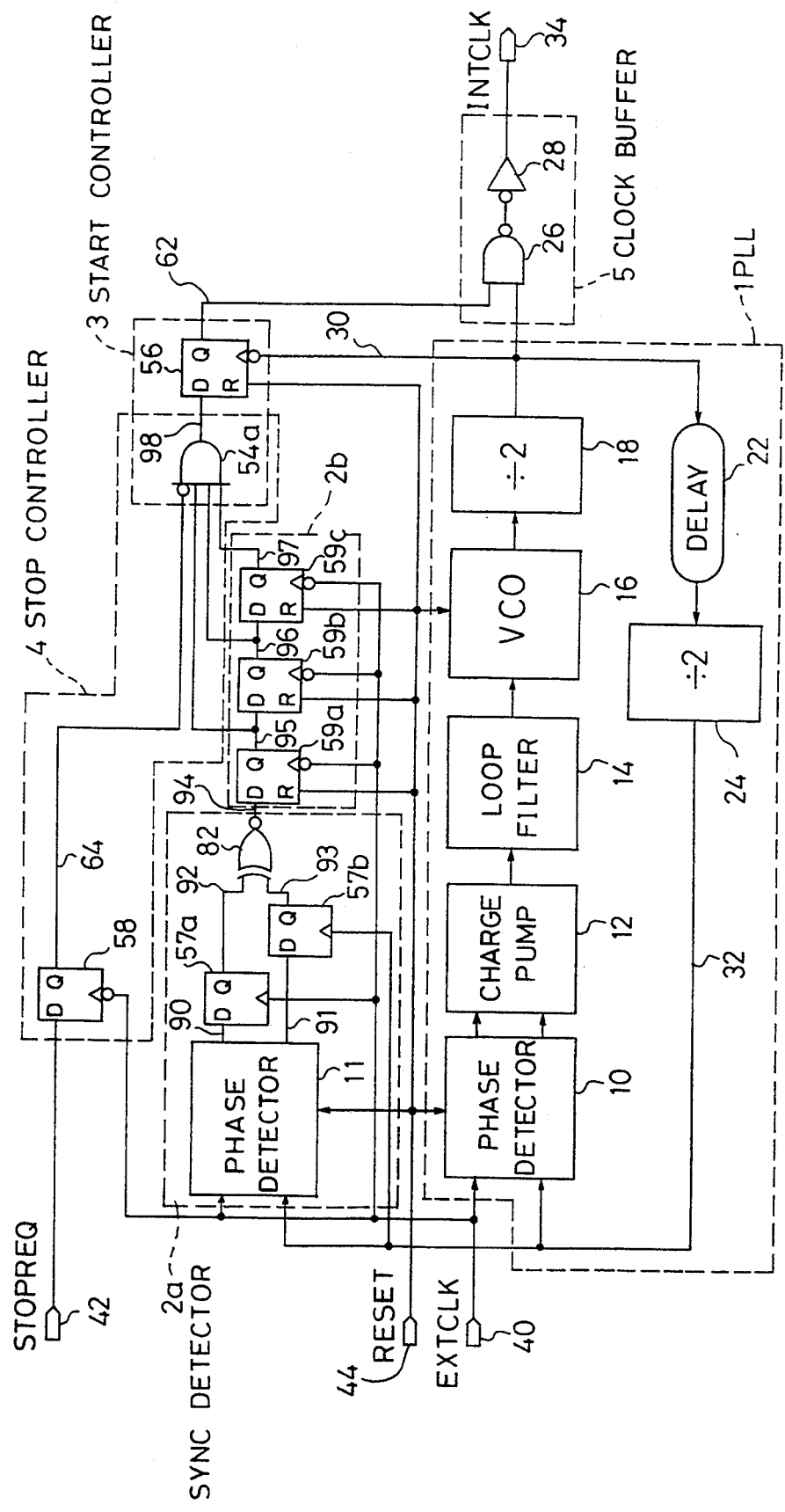
FIG. 8 is a block diagram showing a clock generator of a fourth embodiment of the present invention.

As seen from FIG. 8, a clock generator in accordance with a fourth embodiment comprises the PLL 1, a synchronization detector 2a, a shift register 2b, the start controller 3, the stop controller 4, and the clock buffer 5. Among these elements, the PLL 1, the start controller 3, the stop controller 4, and the clock buffer 5 have the same configurations as those in the first embodiment. However, the AND circuit 54 of FIG. 1 which is a 2-input AND circuit is replaced by a 4-input AND circuit 54a. The synchronization detector 2a comprises a second phase detector 11, a third flip-flop 57a, a fourth flip-flop 57b, and an EX-NOR circuit 82. The shift register 2b is composed of a fifth flip-flop 59a, a sixth flip-flop 59b, and a seventh flip-flop 59c.

The reference clock signal 40 which is supplied from the outside and the feedback clock signal 32 delivered from the second divide-by-two 24 within the PLL 1 are applied not only to the first phase detector 10 but also to the second phase detector 11. A phase lead signal 90 and a phase lag signal 91 both of which are delivered from the second phase detector 11 are fed to the third and fourth flip-flops 57a and 57b as data inputs. A lead latch signal 92 which is an output signal of the third flip-flop 57a and a lag latch signal 93 which is an output signal of the fourth flip-flop 57b are applied to the EX-NOR circuit 82. An EX-NOR signal 94 which is an output signal of the EX-NOR circuit 82 is given to the fifth flip-flop 59a that constitutes a first stage of the shift register 2b, as a data input. A first-stage signal 95 which is an output signal of the fifth flip-flop 59a is fed to the sixth flip-flop 59b as a data input. Further, a second-stage signal 96 which is an output signal of the sixth flip-flop 59b is fed to the seventh flip-flop 59c as a data input. A third-stage signal 97 which is an output signal of the seventh flip-flop 59c is fed, together with the clock stop control signal 64 and the first- and second-stage signals 95 and 96, to the 4-input AND circuit 54a. The synchronization detection signal 98 delivered from the 4-input AND circuit 54a is applied to the first flip-flop 56 as a data input.

Further, the reference clock signal 40 is also fed to the third, and fifth to seventh flip-flops 57a, 59a, 59b, and 59c as clock inputs. The feedback clock signal 32 is also applied to the fourth flip-flop 57b as a clock input. The reset signal 44, supplied from the outside, is utilized to reset not only the first phase detector 10, the VCO 16, and the first flip-flop 56 but also the second phase detector 11 and the fifth to seventh flip-flops 59a, 59b, and 59c.

The operation of the above-described clock generator is explained now. The first phase detector 10 makes a comparison in phase between the reference clock signal 40 and the feedback clock signal 32. In parallel with this, the second phase detector 11, too, makes a comparison in phase between these two signals 40 and 32. The second phase detector 11 looks at the timing of the leading edge of the feedback clock signal 32 with respect to the leading edge of the reference clock signal 40, thereby delivering the phase lead signal 90 and the phase lag signal 91 as phase detection signals. If the feedback clock signal 32 is advanced in phase with respect to the reference clock signal 40, the pulse-like phase lead signal 90 is delivered in synchronism with the leading edge of the feedback clock signal 32. Conversely, if the feedback clock signal 32 is delayed in phase with respect to the reference clock signal 40, the pulse-like phase lag signal 91 is delivered in synchronism with the leading edge of the reference clock signal 40. The phase lead signal 90 is latched in the third flip-flop 57a at the timing of the reference clock signal 40 to become the lead latch signal 92. The phase lag signal 91 meanwhile is latched in the fourth flip-flop 57b at the timing of the feedback clock signal 32 to become the lag latch signal 93. The lead latch signal 92 and the lag latch signal 93 are changed to the EX-NOR signal 94 by means of the EX-NOR circuit 82. The EX-NOR signal 94 is a signal that indicates a period of time during which neither the phase lead signal 90 nor the phase lag signal 91 is issued.

The EX-NOR signal 94 which is an output signal of the EX-NOR circuit 82 is synchronized and shifted by the fifth to seventh flip-flops 59a to 59c on the trailing edge of the reference clock signal 40. Then, the synchronization detection signal 98 becomes asserted by the 4-input AND circuit 54a, providing that all of the first- to third-stage signals 95 to 97 delivered from the flip-flops 59a to 59c are put into a status of "H" level that indicates non-existence of pulses of the phase lead signal 90 as well as the phase lag signal 91, and that the clock stop control signal 64 is not asserted (that is, "L" level). In response to this assertion of the synchronization detection signal 98, the clock propagation control signal 62 becomes asserted. This activates the clock buffer 5, and the source clock signal 30 is fed to a load circuit as the internal clock signal 34. In other words, if the second phase detector 11 judges that no differences in phase have been detected over three consecutive cycles of the reference clock signal 40, this is considered that the PLL 1 has locked-in to the reference clock signal 40 thereby asserting the clock propagation control signal 62.

The second phase detector 11 is given a lower phase detection precision as compared to the first phase detector 10 within the PLL 1. Because of this, the convergence in synchronization detection can be improved. In other words, in the case where perfect phase synchronization is not obtained in the PLL 1 due to the accuracy of the loop filter 14, the stability of the VCO 16, the variation in power supply, noises from the outside, it is still possible to feed the source clock signal 30 to a load circuit as the internal clock signal 34 if within the range of the phase detection precision of the second phase detector 11. If, further, phase shift occurs in a range beyond the phase detection precision of the second phase detector 11, the source clock signal 30 is prevented from propagating to a load circuit as the internal clock signal 34. This prevents malfunctions caused by phase difference.

Figure 9:
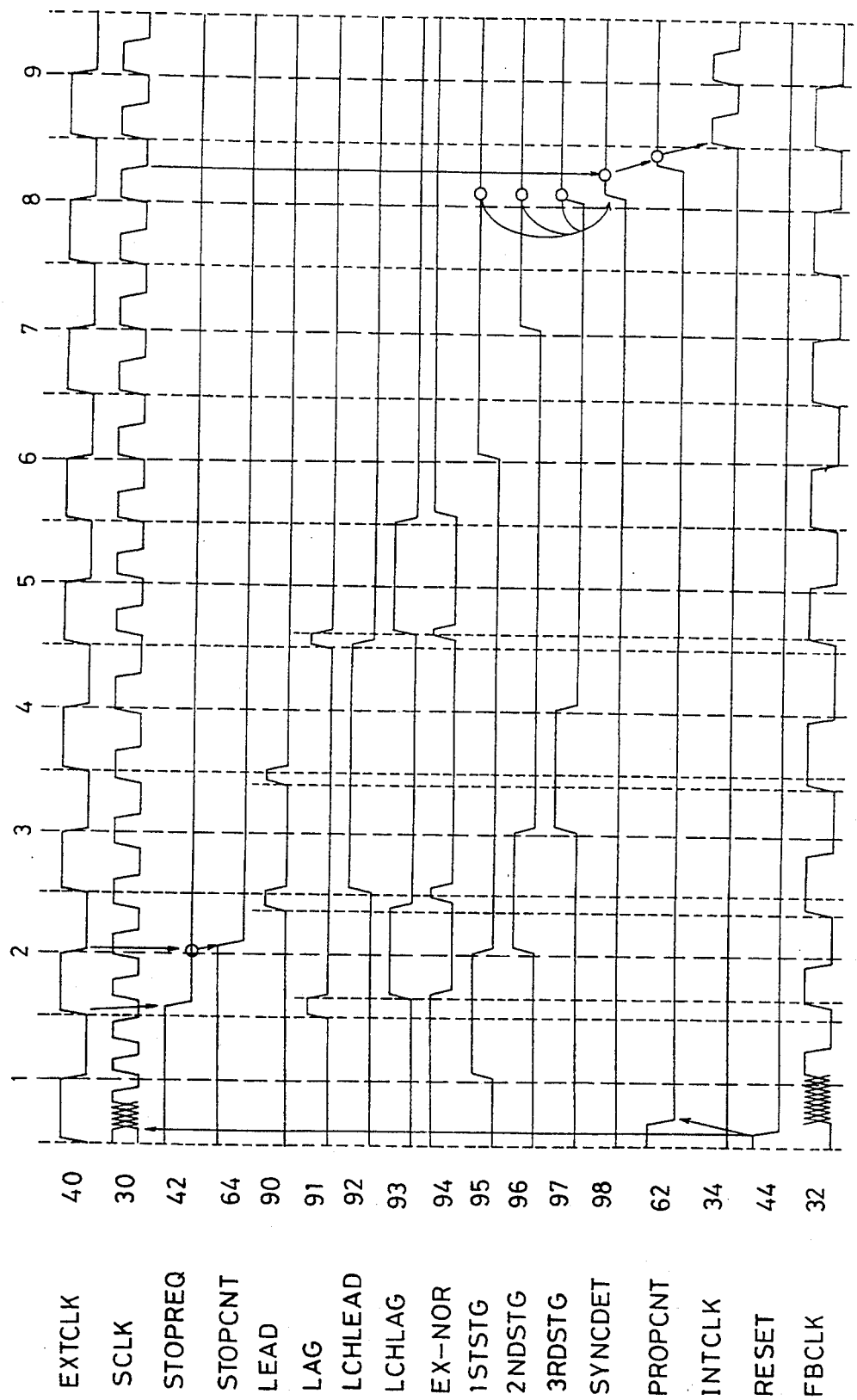
FIG. 9 is a timing diagram showing a sequence in which internal clock signals start being generated in the clock generator of FIG. 8.

With reference to FIG. 9, a sequence is explained in which the generation of the internal clock signal 34 starts in a clock generator of this embodiment. In synchronism with the reference clock signal 40, the reset signal 44 is canceled at cycle 1. This causes the VCO 16 to begin oscillating. The PLL 1 functions so that the reference clock signal 40 and the feedback clock signal 32 delivered from the second divide-by-two 24 become the same in frequency as well as in phase. FIG. 9 shows an example in which the phase lag of the feedback clock signal 32 is detected at cycle 2, the phase lead of the feedback clock signal 32 is detected at cycles 3 and 4, the phase lag of the feedback clock signal 32 is detected at cycle 5, and no phase differences are detected between the reference clock signal 40 and the feedback clock signal 32 after cycle 6. From cycle 6 on, the EX-NOR circuit 82 keeps asserting the EX-NOR signal 94 at "H" level. The continuous assertion of the EX-NOR signal 94 over three consecutive reference cycles (i.e., cycles 6 to 8) causes the synchronization detection signal 98 to become asserted. Then, the clock propagation control signal 62 becomes asserted. This allows the feed of the internal clock signal 34 to a load circuit at cycle 9.

The sequence for stopping the internal clock signal 34, and the sequence for restarting the feed of the internal clock signal 34 interrupted are not described here, since they are similar to those in FIGS. 3 and 4.

In accordance with this embodiment, the second phase detector 11 performs the function of detecting the phase difference between the reference clock signal 40 and the feedback clock signal 32, and the detection of synchronization is made using the third to seventh flip-flops 57a, 57b, 59a, 59b, and 59c, the EX-NOR circuit 82, and the 4-input AND circuit 54a. This results in generation of the clock propagation control signal 62. The propagation of the source clock signal 30 to a load circuit is prevented at the clock buffer 5 until the PLL 1 becomes locked-in to the reference clock signal 40. Therefore, it is possible to realize a function of starting clocking of the internal clock signal 34 at a particular phase. Further, by controlling the clock buffer 5 based on the clock stop request signal 42, it is possible to realize functions of interrupting and then restarting clocking at a particular phase.

If no phase differences have been found between the reference clock signal 40 and the feedback clock signal 32 over a certain period (that is, three consecutive reference cycles in this embodiment), this is regarded that the phase synchronization of the PLL 1 is obtained. However, such a period can be set freely by changing the number of stages of flip-flops in the shift register 2b and the number of inputs of the AND circuit 54a.

If relatively great phase jitter can be tolerated by the source clock signal 30 delivered from the PLL 1, it is possible to omit the provision of the second phase detector 11 and use outputs of the first phase detector 10 within the PLL 1 as the phase lead signal 90 and the phase lag signal 91.

FIFTH EMBODIMENT

Figure 10:
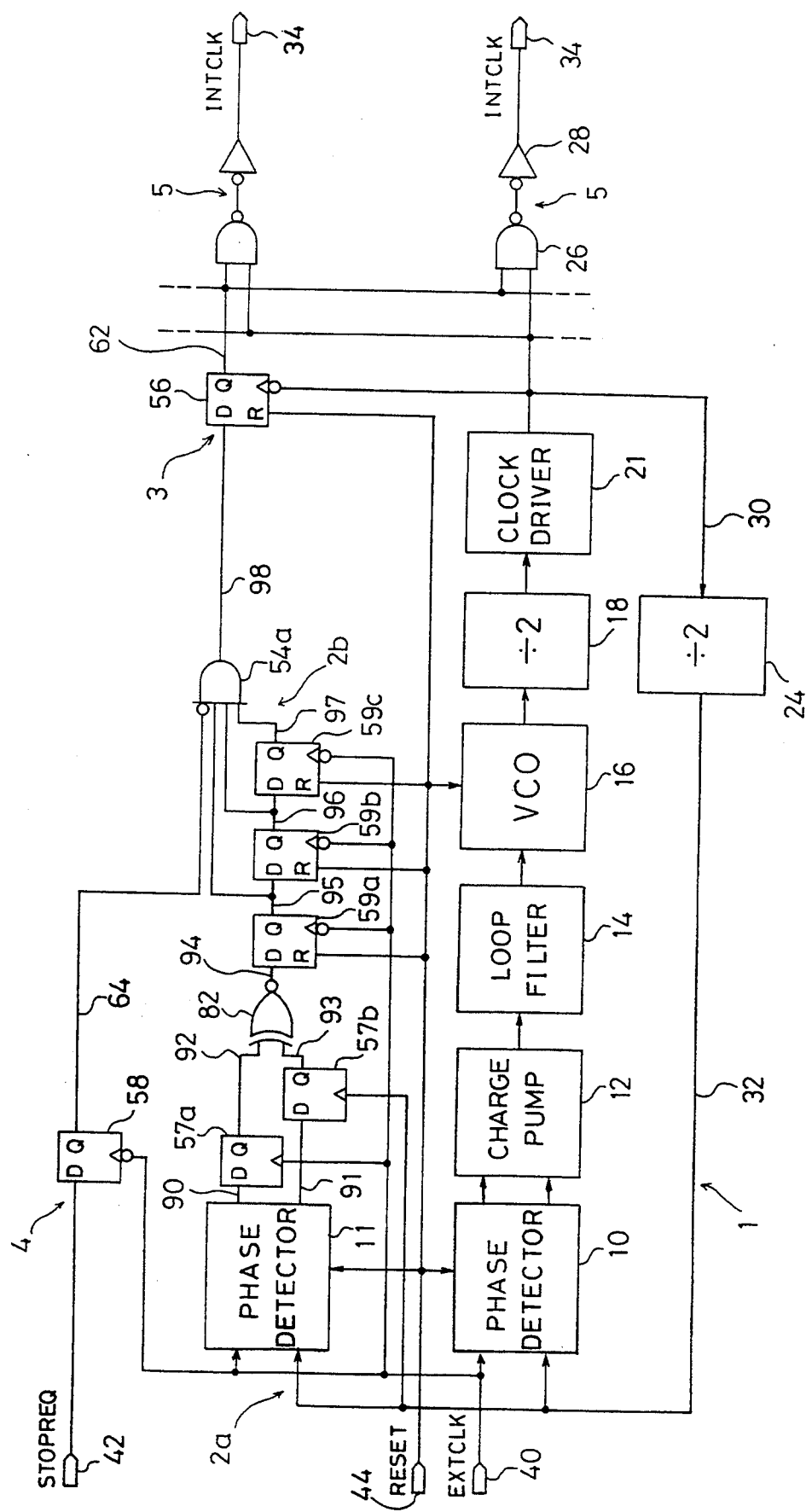
FIG. 10 is a block diagram showing a clock generator of a fifth embodiment of the present invention.

FIG. 10 shows the layout of a clock generator in accordance with a fifth embodiment of the invention. The relationship between the fourth embodiment (FIG. 8) and the fifth embodiment (FIG. 10) is the same as that between the first embodiment (FIG. 1) and the second embodiment (FIG. 5). The clock generator of this embodiment is not detailed here, accordingly.

Like the second embodiment, owing to the provision of the clock driver 21 at the output stage of the PLL 1, the clock skew between the reference clock signal 40 and the internal clock signal 34 can be reduced to the same degree that prior art techniques can achieve (see FIG. 12), without providing the delay circuit 22 to the PLL 1.

SIXTH EMBODIMENT

Figure 11:
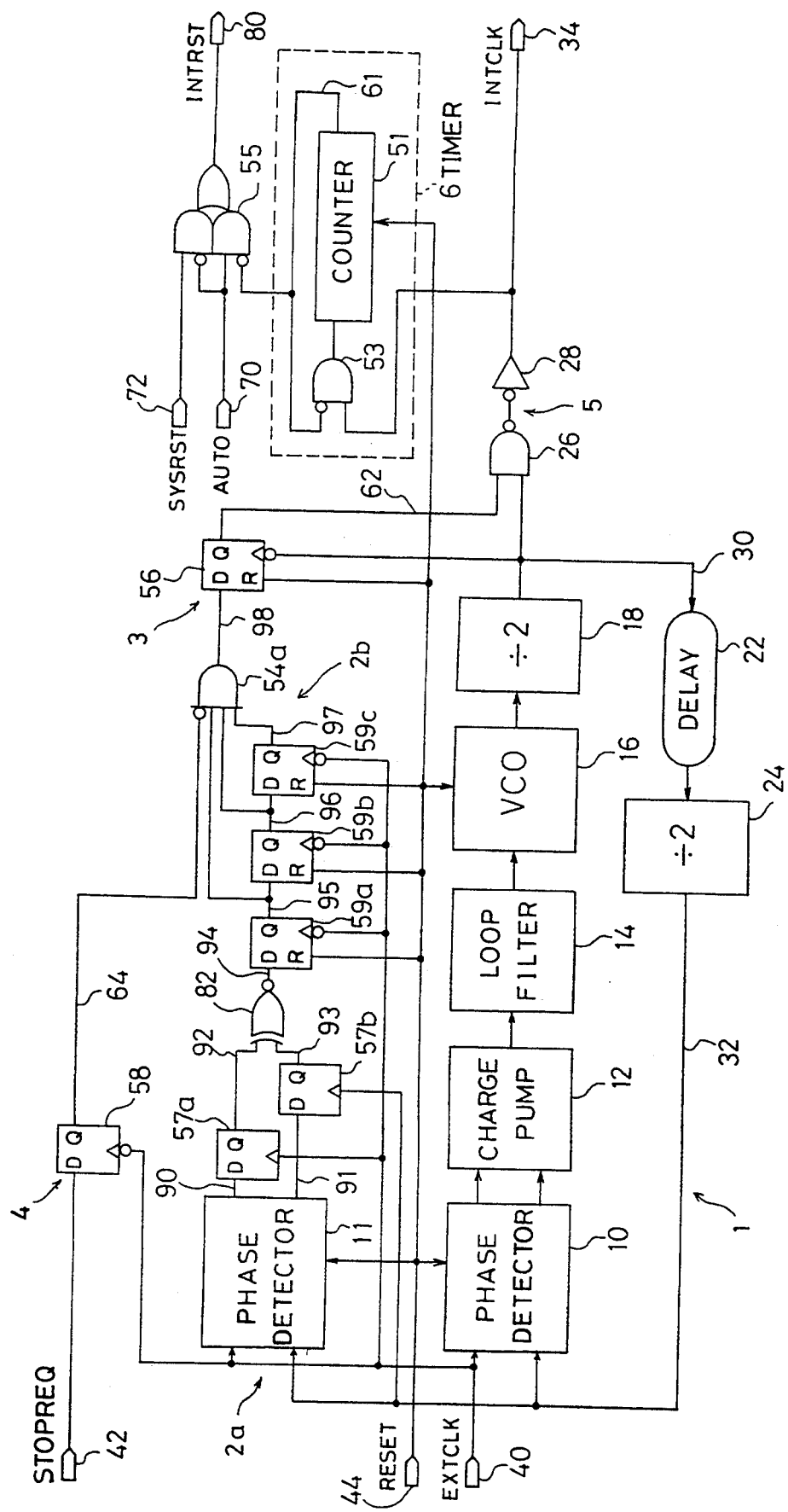
FIG. 11 is a block diagram showing a clock generator of a sixth embodiment of the present invention.

FIG. 11 shows the layout of a clock generator in accordance with a sixth embodiment of the invention. The relationship between the fourth embodiment (FIG. 8) and the sixth embodiment (FIG. 11) is the same as that between the first embodiment (FIG. 1) and the third embodiment (FIG. 6). The clock generator of this embodiment is not detailed here, accordingly.

In accordance with this embodiment, like the third embodiment, the second counter 51 counts the number of cycles at which the internal reset signal 80 is to be applied. The internal reset signal 80 is kept provided for a predetermined period since the clocking of the internal clock signal 34 starts. Thereafter, the internal reset signal 80 is canceled automatically. Accordingly, it is possible to provide the internal reset signal 80 without taking in account the initial timing of clocking of the internal clock signal 34.

I claim:

1. A clock generator for feeding as a source clock signal an internal clock signal in synchronism with an external clock signal serving as a reference clock signal to a load circuit, said clock generator comprising:

a clock signal generation means for generating the source clock signal, having an initial phase, to be input to said load circuit, said clock signal generation means further adjusting the initial phase of said source clock signal generated to another phase causing the source clock signal to be synchronous with the reference clock signal; and a clock signal propagation control means for controlling the propagation of the source clock signal delivered from said clock signal generation means by preventing said source clock signal as the internal clock signal from being outputted to said load circuit unless the source clock signal can be fed in synchronism with said reference clock signal.

2. A clock generator as in claim 1, wherein said clock signal generation means includes a phase locked loop for generating said source clock signal having a frequency that is an integral multiple of the frequency of said reference clock signal, said phase locked loop including:
- a phase detector for producing either a phase lead signal if a feedback clock signal is leading in phase with respect to said reference clock signal or a phase lag signal if said feedback clock signal is lagging in phase with respect to said reference clock signal;
- a charge pump for receiving said phase lead or phase lag signal, converting said phase lead or phase lag signal into a voltage value proportional to said phase lead or lag signal, and producing an output signal indicative of said proportional voltage value;
- a loop filter for filtering a low frequency component contained in said output signal of said charge pump, and for producing said low frequency component as a control voltage;
- a voltage-controlled oscillator for generating a voltage controlled clock signal having a frequency corresponding to the control voltage; and
- a frequency divider for generating said feedback clock signal having a frequency that is an integral submultiple of the frequency of said voltage controlled clock signal, said feedback clock signal feeding back as an input to said phase detector.

3. A clock generator as in claim 2, wherein said clock signal propagation control means includes:
- a clock buffer which receives said source clock signal from said phase locked loop and controls input of said source clock signal to said load circuit; and
- a clock signal feed start control means for preventing said clock buffer from inputting a buffered source clock signal to said load circuit until said source clock signal, delivered from said phase locked loop, becomes synchronous with said reference clock signal, and causing said clock buffer to input said buffered source clock signal to said load circuit in synchronism with said reference clock signal at the time when said source clock signal becomes synchronous with said reference clock signal.

4. A clock generator as in claim 3, wherein said clock signal propagation control means further includes a clock signal feed stop control means for preventing input of said buffered source clock signal from said clock buffer to said load circuit in synchronism with said reference clock signal at the time when a clock stop request signal becomes asserted.

5. A clock generator as in claim 3, wherein said phase locked loop further includes a delay circuit for compensating for a time delay caused by said clock buffer, said delay circuit delaying said source clock signal so that a difference in phase between said feedback clock signal and said source clock signal equals a difference in phase between said source clock signal and said buffered source clock signal.

6. A clock generator as in claim 2, wherein:
said phase locked loop further includes a clock driver controlled by said voltage controlled clock signal for driving a plurality of signal lines with said source clock signal; and
said clock signal propagation control means includes:
- a plurality of clock buffers, each of said clock buffers receiving said source clock signal from said clock driver through said signal lines and controlling output of said source clock signal to a plurality of load circuits; and
- a clock signal feed start control means for preventing each of said clock buffers from inputting a buffered source clock signal to each of said load circuits until said source clock signal delivered from said clock driver is synchronous with said reference clock signal, and causing each of said clock buffers to send said buffered source clock signal to each of said load circuits in synchronism with said reference clock signal at the time when said source clock signal is synchronous with said reference clock signal.

7. A clock generator as in claim 1, further including a reset control means for canceling assertion of an internal reset signal being sent to said load circuit when said source clock signal is sent to said load circuit.

8. A clock generator as in claim 7, wherein said reset control means includes a counter for producing a count completion signal to cancel assertion of said internal reset signal being sent to said load circuit when a set number of pulses of said source clock signal delivered from said clock signal propagation control means have been counted.

9. A clock generator as in claim 7, wherein said reset control means includes a counter for delivering a count completion signal to cancel assertion of said internal reset signal being sent to said load circuit when a set number of pulses of said reference clock signal applied to said clock signal generation means have been counted.

10. A clock generator for feeding as a source clock signal an internal clock signal in synchronism with an external clock signal serving as a reference clock signal to a load circuit, said clock generator comprising:
- a clock signal generation means for generating said source clock signal, having an initial phase, to be output to said load circuit, said clock signal generation means further adjusting the phase of said source clock signal generated to be synchronous with said reference clock signal,
- a time measurement means for measuring a length of time necessary for said source clock signal delivered from said clock generation means to become synchronous with said reference cloak signal; and
- a clock signal transmission control means for preventing transmission of said source clock signal as an internal clock signal to said load circuit until said time measurement means completes measurement of the time necessary for said source and reference clock signals to be synchronous.

11. A clock generator as in claim 10, wherein said clock signal generation means includes a phase locked loop for generating said source clock signal having a frequency that is an integral multiple of said reference clock signal, said phase locked loop comprising:
- a phase detector for delivering either a phase lead signal if a feedback clock signal is leading in phase with respect to said reference clock signal or a phase lag signal if said feedback clock signal is lagging in phase with respect to said reference clock signal;

a charge pump for receiving said phase lead and phase lag signals delivered from said phase detector said charge pump converting said phase lead or phase lag signals into a voltage value proportional to said phase lead or lag signal, and producing an output signal indicative of said proportional voltage value;

a loop filter for filtering a low frequency component contained in said output signal of said charge pump, and outputting said low frequency component as a control voltage, a voltage-controlled oscillator for generating a voltage controlled clock signal of a frequency corresponding to said control voltage delivered from said loop filter; and a frequency divider for generating said feedback clock signal having a frequency that is an integral submultiple of said frequency of said voltage controlled clock signal said feedback clock signal feeding back to said phase detector.

12. A clock generator as in claim 11, wherein said time measurement means includes count means for producing a count completion signal for causing said clock signal transmission control means to input said source clock signal to said load circuit upon finishing counting a set number of pulses of said reference clock signal applied to said phase locked loop.

13. A clock generator as in claim 12, wherein said count means includes an AND circuit having as an input said reference clock signal; and a counter for producing a count completion signal causing said clock signal transmission control means to send said source clock signal to said load circuit upon finishing counting said set number of pulses of an output signal of said AND circuit, and for sending said count completion signal delivered from said counter back to said AND circuit as another input.

14. A clock generator as in claim 13, wherein said clock signal transmission control means includes:

a clock buffer, which receives said source clock signal from said phase locked loop and controls input of said source clock signal to said load circuit;

a start controller for preventing said clock buffer from inputting said buffered source clock signal to said load circuit until said counter produces a count completion signal, and causing said clock buffer to send said buffered source clock signal to said load circuit in synchronism with said reference clock signal at the time when said counter produces said count completion signal, and a stop controller for causing said clock buffer to prohibit input of said buffered source clock signal to said load circuit in synchronism with said reference clock signal at the time when a clock stop request signal becomes asserted, and causing said clock buffer to momentarily restart input of said buffered clock signal to said load circuit in synchronism with said reference clock using said count completion signal from said counter.

15. A clock generator for feeding as a source clock signal an internal clock signal in synchronism with an external clock signal serving as a reference clock signal to a load circuit, said clock generator comprising:

a clock signal generation means for generating a source clock signal having an initial phase, said clock signal generation means further adjusting the phase of said source clock signal generated to another phase to be synchronous with a reference clock signal, a synchronization detection means for detecting the synchronization between said source clock signal produced by said clock generation means and said reference clock signal input to said clock signal generation means; and a clock signal transmission control means for preventing transmission of said source clock signals delivered from said clock signal generation means to said load circuit until said synchronization detection means detects synchronization between said source clock signal produced by said clock generation means and said reference clock signal input to said clock generation means.

16. A clock generator as in claim 15, wherein said clock signal generation means includes a phase locked loop for generating said source clock signal having a frequency that is an integral multiple of a frequency of said reference clock signal, said phase locked loop comprising:

a first phase detector for producing either a phase lead signal if a feedback clock signal is leading in phase with respect to said reference clock signal or a phase lag signal if said feedback clock signal is lagging with respect to said reference clock signal;

a charge pump for receiving said phase lead or phase lag signal, converting said phase lead or lag signal into a voltage value proportional to said phase lead or phase lag signal, and producing an output signal indicative of said proportional voltage value;

a loop filter for filtering a low frequency component contained in said output signal of said charge pump, and for outputting said low frequency component as a control voltage, a voltage-controlled oscillator for generating a as voltage controlled clock signal having a frequency corresponding to said control voltage; and a frequency divider for generating said feedback clock signal having a frequency that is an integral submultiple of said frequency of said voltage controlled clock signal, said feed back clock signal feeding back as an input to said phase detector.

17. A clock generator as in claim 16, wherein said synchronization detection means includes phase detection means for producing a synchronization detection signal causing said clock signal transmission control means to transmit said source clock signal to said load circuit when said reference clock signal and said feedback clock signal, both applied to said first phase detector within said phase locked loop, are in phase.

18. A clock generator as in claim 17, wherein:
said phase detection means includes:

a second phase detector for making a comparison in phase between said reference clock signal and said feedback clock signal, both applied to said first phase detector within said phase locked loop, and delivers either a phase lead signal if said feedback clock signal is leading in phase with respect to said reference clock signal or a phase lag signal if said feedback signal is lagging in phase with respect to said reference clock signal, said second phase detector having a phase detection precision lower than that of said first phase detector, synchronization verification means for producing a synchronization detection signal if said second phase detector has not produced said phase lead or phase lag signals over a plurality of pulse periods of a reference clock signal and for storing said phase lead or phase lag signals that are produced, said second phase detector having a phase detection precision lower than that of said first phase detector.

19. A clock generator as in claim 18, wherein said clock signal transmission control means comprises:

a clock buffer which receives said source clock signal from said phase locked loop and controls input of said source clock signal to said load circuit;

a start controller for preventing said clock buffer from inputting a buffered clock signal to said load circuit until said phase detection means produces said synchronization detection signal, and causing said clock buffer to send said buffered clock signal to said load circuit in synchronism with said reference clock signal at the time when said phase detection means delivers a synchronization detection signal; and a stop controller for causing said clock buffer to stop input of said buffered source clock signal to said load circuit in synchronism with said reference clock signal at a time when a clock stop request signal becomes asserted, and causing said clock buffer to momentarily restart input of said buffered source clock signal to said load circuit in synchronism with said reference clock using said synchronization detection signal stored in said synchronization verification means.

* * * * *

UNITED STATES PATENT AND TRADEMARK OFFICE
CERTIFICATE OF CORRECTION

PATENT NO. : 5,347,232
DATED : September 13, 1994
INVENTOR(S) : Yoshito Nishimichi It is certified that error appears in the above-indentified patent and that said Letters Patent is hereby corrected as shown below:

Column 1, Line 36: "produces;" should read --produces--.

Column 2, Line 6: "lead" should read --load--.

Column 2, Line 9: "lead" should read --load--.

Column 2, Line 43: "lead" should read --load--.

Column 2, Line 48: "lead" should read --load--.

Column 3, Line 3: "nor" should read --not--.

UNITED STATES PATENT AND TRADEMARK OFFICE
CERTIFICATE OF CORRECTION

PATENT NO.  : 5,347,232

DATED       : September 13, 1994

INVENTOR(S) : Yoshito Nishimichi

It is certified that error appears in the above-indentified patent and that said Letters Patent is hereby corrected as shown below:

Column 5, Line 8:   "504" should read --50%--.

Column 5, Line 59:  "counting, in" should read --counting.  In--.

Column 7, Line 17:  "road" should read --load--.

Column 9, Line 28:  "tills" should read --this--.

Column 16, Line 37: "as" should be deleted.

Column 16, Line 43: "feed back" should read --feedback--.

Signed and Sealed this

Sixth Day of June, 1995

Attest:

BRUCE LEHMAN

*Attesting Officer*    Commissioner of Patents and Trademarks

UNITED STATES PATENT AND TRADEMARK OFFICE
CERTIFICATE OF CORRECTION

PATENT NO. : 5,347,232
DATED : September 13, 1994
INVENTOR(S) : Yoshito Nishimichi It is certified that error appears in the above-indentified patent and that said Letters Patent is hereby corrected as shown below:

Column 12, Lines 58-59: "A clock generator for feeding as a source clock signal an internal clock signal" should read -- A clock generator for feeding a source clock signal as an internal clock signal--.

Column 14, Lines 40-41: "A clock generator for feeding as a source clock signal an internal clock signal" should read --A clock generator for feeding a source clock signal as an internal clock signal--.

Column 15, Lines 62-63: "A clock generator for feeding as a source clock signal an internal clock signal" should read --A clock generator for feeding a source clock signal as an internal clock signal--.

Signed and Sealed this

Fifteenth Day of October, 1996

Attest:

BRUCE LEHMAN

Attesting Officer     Commissioner of Patents and Trademarks